(12) United States Patent
Buono

(10) Patent No.: US 9,013,239 B2
(45) Date of Patent: Apr. 21, 2015

(54) AUDIO AMPLIFIER POWER SUPPLY WITH INHERENT POWER FACTOR CORRECTION

(71) Applicant: Crestron Electronics, Inc., Rockleigh, NJ (US)

(72) Inventor: Robert Buono, Ringwood, NJ (US)

(73) Assignee: Crestron Electronics Inc., Rockleigh, NJ (US)

( * ) Notice: Subject to any disclaimer, the term of this patent is extended or adjusted under 35 U.S.C. 154(b) by 0 days.

(21) Appl. No.: 14/268,313

(22) Filed: May 2, 2014

(65) Prior Publication Data

US 2014/0240051 A1 Aug. 28, 2014

Related U.S. Application Data

(63) Continuation-in-part of application No. 13/472,289, filed on May 15, 2012, now Pat. No. 8,754,705.

(51) Int. Cl.
| | |
|---|---|
| *H03F 3/04* | (2006.01) |
| *H02M 1/42* | (2007.01) |
| *H02M 3/28* | (2006.01) |
| *H03F 1/02* | (2006.01) |
| *H03F 3/183* | (2006.01) |

(52) U.S. Cl.
CPC ............ *H03F 3/183* (2013.01); *H02M 1/4258* (2013.01); *H02M 3/285* (2013.01); *H03F 1/0205* (2013.01); *H03F 2200/03* (2013.01); *Y02B 70/126* (2013.01)

(58) Field of Classification Search
USPC .......................................... 330/297, 127, 165
IPC ........................................................ H03F 3/04
See application file for complete search history.

(56) References Cited

U.S. PATENT DOCUMENTS

| | | | |
|---|---|---|---|
| 4,571,551 A | 2/1986 | Trager | |
| 4,805,081 A * | 2/1989 | Chambers et al. | ............... 363/96 |
| 5,200,711 A | 4/1993 | Andersson | |
| 6,285,251 B1 * | 9/2001 | Dent et al. | ..................... 330/127 |
| 6,563,377 B2 | 5/2003 | Butler | |
| 6,985,034 B1 | 1/2006 | Prokin | |
| 7,839,215 B2 * | 11/2010 | Mendenhall | ................... 330/251 |
| 2005/0017699 A1 * | 1/2005 | Stanley | ......................... 323/282 |
| 2006/0066264 A1 * | 3/2006 | Ishigaki et al. | ................ 315/291 |
| 2006/0186955 A1 * | 8/2006 | Quilter | ............................ 330/10 |
| 2010/0165670 A1 | 7/2010 | Piazzesi | |
| 2013/0169165 A1 * | 7/2013 | Sadwick et al. | .............. 315/152 |

OTHER PUBLICATIONS

Rodgers, Understanding Buck-Boost Power Stages in Switch Mode Power Supplies, Application Report, Mar. 1999 (revised Nov. 2002), SLVA 059A, Texas Instruments, Dallas TX US.

* cited by examiner

*Primary Examiner* — Patricia Nguyen
(74) *Attorney, Agent, or Firm* — Creston Electronics Inc.

(57) ABSTRACT

An audio amplifier is powered by a switch mode power supply optimized for audio applications. The power supply includes a rectifier circuit and a discontinuous mode multiphase isolated flyback power circuit and does not require a separate power factor correction stage. The discontinuous mode multiphase isolated flyback power circuit includes multiple isolated flyback converters operating synchronously to each convert a portion of the power and supply a phase-summed direct current voltage to the audio amplifier.

16 Claims, 14 Drawing Sheets

Prior Art FIG. 1

AUDIO AMPLIFIER POWER SUPPLY WITH INHERENT POWER FACTOR CORRECTION

BACKGROUND OF THE INVENTION

1. Technical Field

The present invention relates to audio amplifiers and more specifically to power supplies for audio amplifiers.

2. Background Art

Typically one of the last components in an audio distribution chain, audio amplifiers amplify a low power audio signal to a level suitable for driving a loudspeaker. As such, power gain is a major design factor for audio amplifiers. However, for a variety of reasons power supplies in audio amplifiers are not optimized for use in audio applications which results in unnecessary cost and increased size. This is particularly true of audio amplifiers employing switched-mode power supplies (SMPS) and class D amplification.

Under mandates in certain countries power supplies in electrical devices, including audio amplifiers, must meet minimum standards for power factor. A dimensionless number between zero (0) and one (1), power factor gives the ratio of real power to apparent power. The SMPS currently used in audio amplifiers cannot meet these standards without power factor correction (PFC). A common solution is to add a distinct PFC stage to the power supply.

Prior Art FIG. 1 is a block diagram of an illustrative power supply with power factor correction that is commonly employed in prior art amplifiers. The prior art power supply includes three separate circuits: a rectification circuit 11, a PFC correction circuit 13 and 12a conversion and isolation circuit. In this illustrative power supply, the power factor correction circuit 12 includes a boost regulator and is inserted between the rectification circuit 11 and the conversion and isolation circuit 13. The PFC circuit 12 receives a rectified direct current (DC) voltage from the rectifier circuit 11 and supplies a boosted DC voltage to the isolation and conversion circuit 13 at a voltage higher than the highest peak rectified voltage.

The addition of the power factor correction circuit 12 requires additional components which increase the cost and size of the power supply. Additionally, the second switching component in the PFC stage also introduces electromagnetic interference (EMI), which must be filtered out, as well as power conversion losses due to full power being converted two times.

There is now a need for an improved power supply that is optimized for use in an audio amplifier.

SUMMARY OF THE INVENTION

It is to be understood that both the general and detailed descriptions that follow are exemplary and explanatory only and are not restrictive of the invention.

DISCLOSURE OF INVENTION

Principles of the invention provide devices and methods for optimally supplying power to an audio power amplifier. For example, according to a first aspect, the present invention provides an audio amplifier power supply with inherent power factor correction. The power supply comprises a rectifier circuit configured for rectifying an input voltage from an alternating current (AC) power source and a discontinuous mode multiphase isolated flyback power circuit configured for receiving the rectified input voltage from the rectifier circuit and supplying a phase-summed direct current (DC) voltage to an audio power amplifier. The discontinuous mode multiphase isolated flyback power circuit further comprises a balancing circuit configured for balancing currents across each phase of the multiphase isolated flyback power circuit.

According to a second aspect, the present invention provides a method for supplying power inherently corrected for power factor comprising the steps of: rectifying an AC input voltage; controlling the duty cycle of a switch of a parallel isolated flyback converter to convert a portion of the input power; repeating the step of controlling the duty cycle of a switch of a parallel isolated flyback converter for n parallel isolated flyback converters in succession such that the duty cycle of each successive switch of the n parallel isolated flyback converters is 360/n degrees out of phase with the duty cycle of the previous switch; supplying a phase summed direct current voltage to an audio power amplifier; determining a current through a switch for each of the n parallel isolated flyback converters; calculating an average current of each of the n parallel isolated flyback converters as a direct current value; for each of the n parallel isolated flyback converters, determining a difference between the average current and the current in that phase; and for each of the n parallel isolated flyback converters, adjusting the duty cycle of that parallel isolated flyback converter according to the determined difference The present invention seeks to overcome or at least ameliorate one or more of several problems, including but not limited to eliminating the need for a power factor correction stage in a switched mode power supply for an audio amplifier.

BRIEF DESCRIPTION OF DRAWINGS

The accompanying figures further illustrate the present invention.

The components in the drawings are not necessarily drawn to scale, emphasis instead being placed upon clearly illustrating the principles of the present invention. In the drawings, like reference numerals designate corresponding parts throughout the several views.

BRIEF DESCRIPTION OF THE SEVERAL VIEWS OF THE DRAWING

Figure 1:
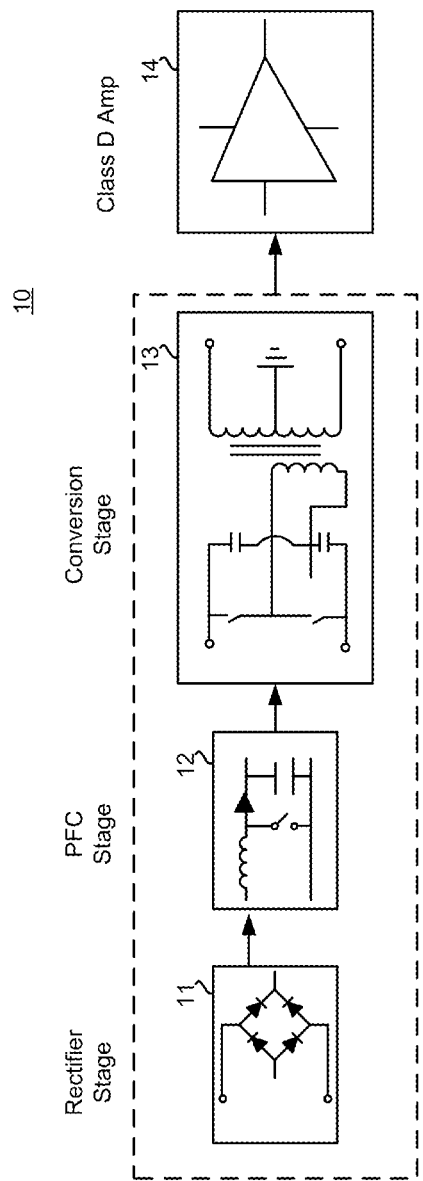

Prior Art FIG. 1 is a block diagram of an illustrative prior art power supply with power factor correction.

Figure 2:
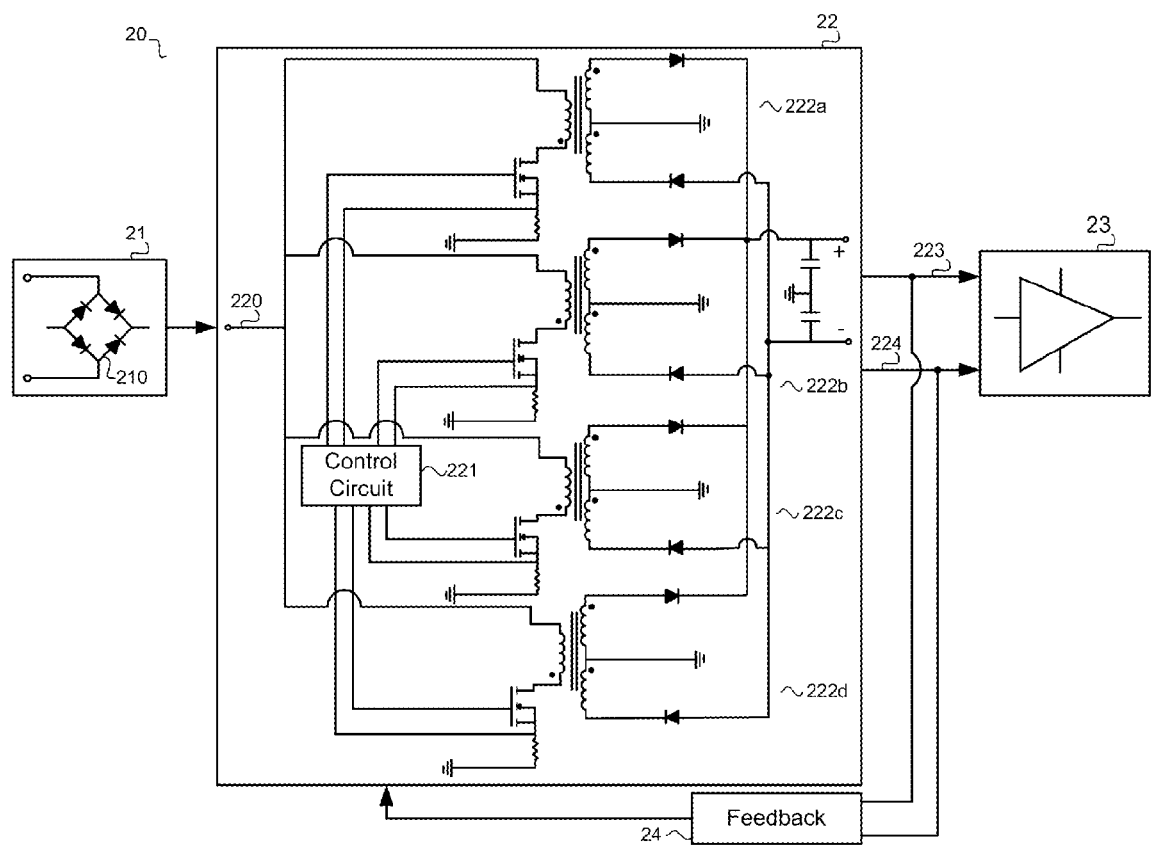

FIG. 2 shows a block diagram of the inventive audio amplifier comprising a power supply optimized for audio applications according to an illustrative embodiment of the invention.

Figure 3:
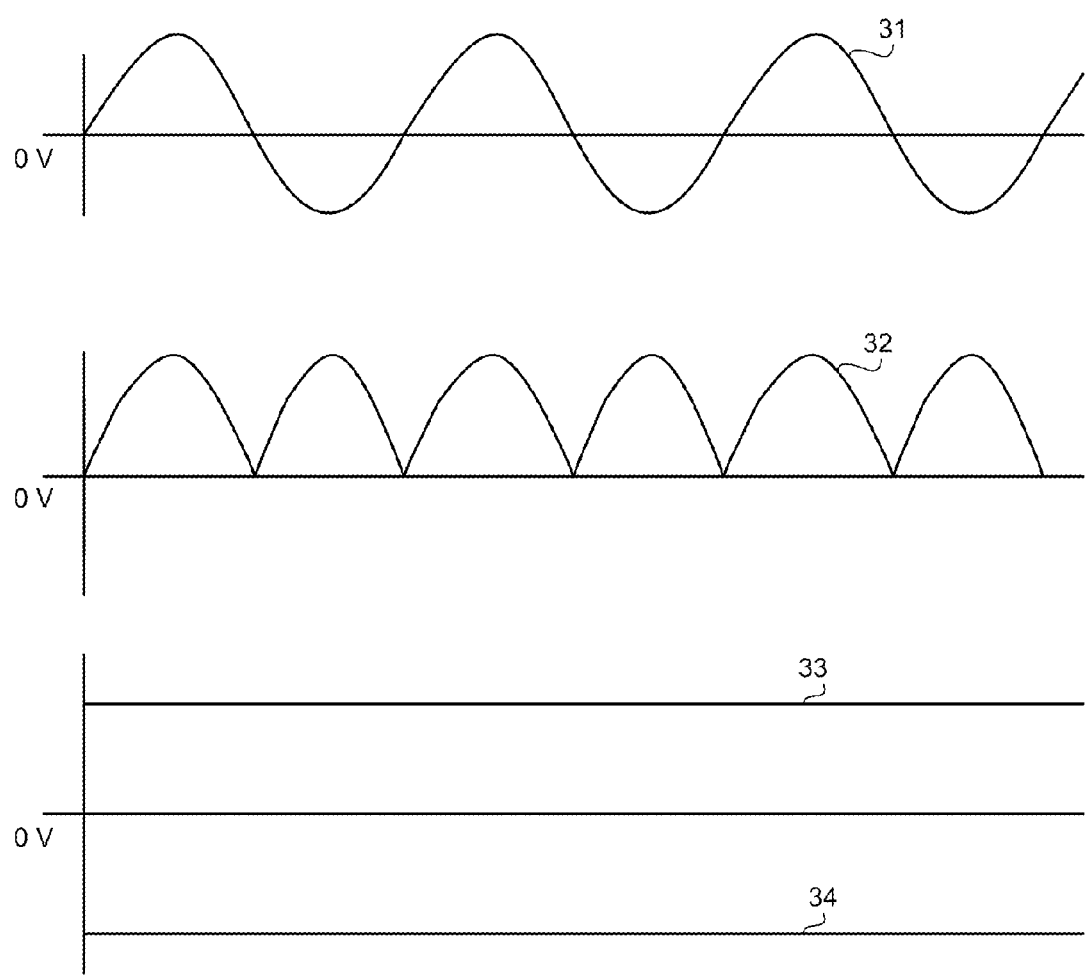

FIG. 3 illustrates alternating current line input voltage and current waveforms associated with the audio amplifier power supply of FIG. 2 according to an illustrative embodiment of the invention.

Figure 4:
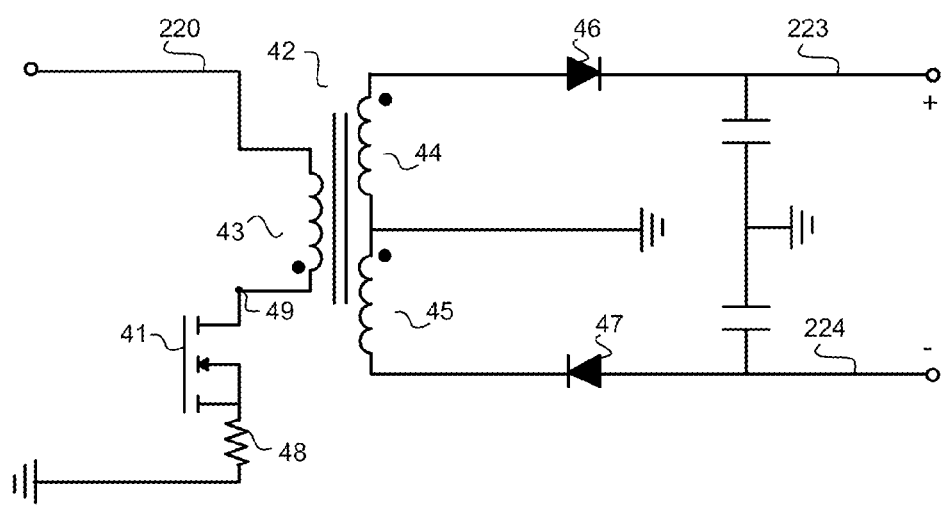

FIG. 4 is a diagram of a parallel isolated flyback converter of the audio amplifier of FIG. 2, according to an illustrative embodiment of the invention.

Figure 5:
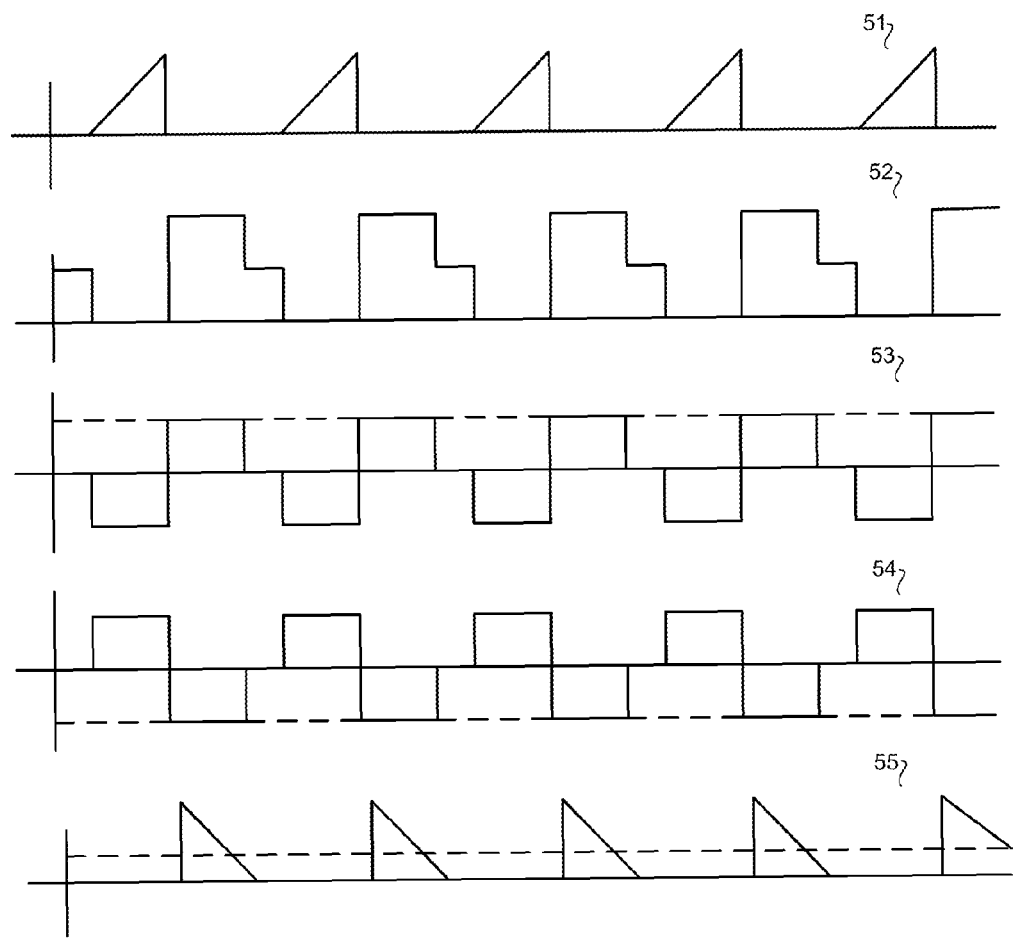

FIG. 5 illustrates voltage and current waveforms associated with the parallel isolated flyback converter of FIG. 4 according to an illustrative embodiment of the invention.

Figure 6:
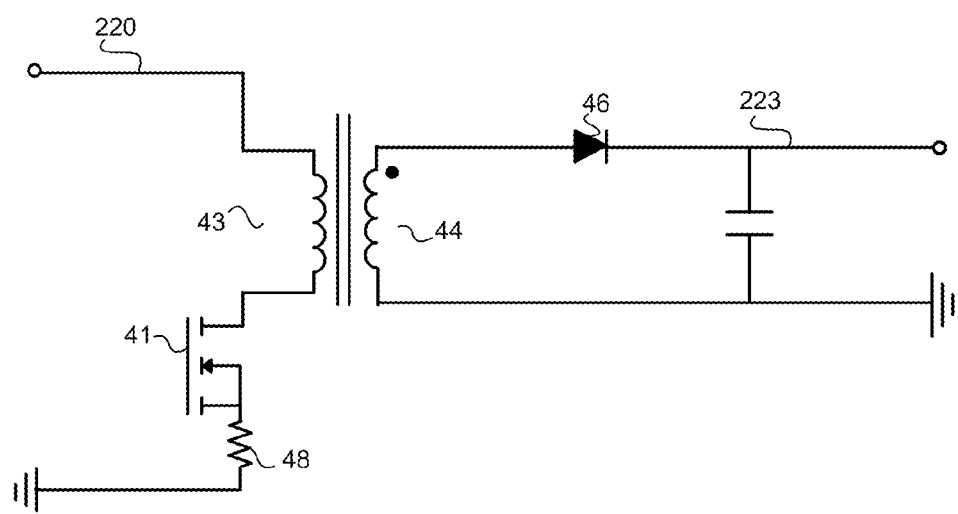

FIG. 6 is a diagram of a parallel isolated flyback converter of the audio amplifier of FIG. 2, according to an illustrative embodiment of the invention.

Figure 7:
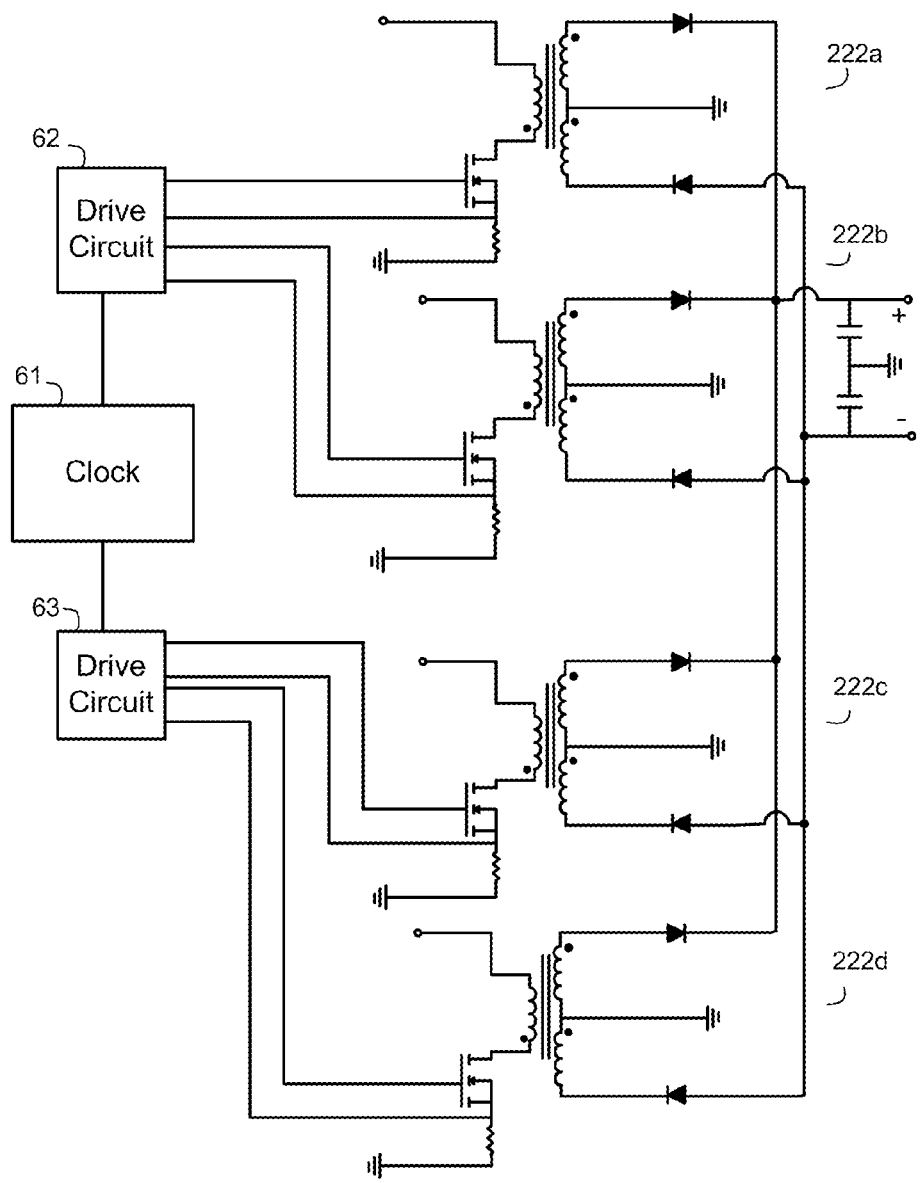

FIG. 7 is a diagram of the multiphase isolated flyback power circuit of the power supply of FIG. 2 according to a further embodiment of the invention.

Figure 8:
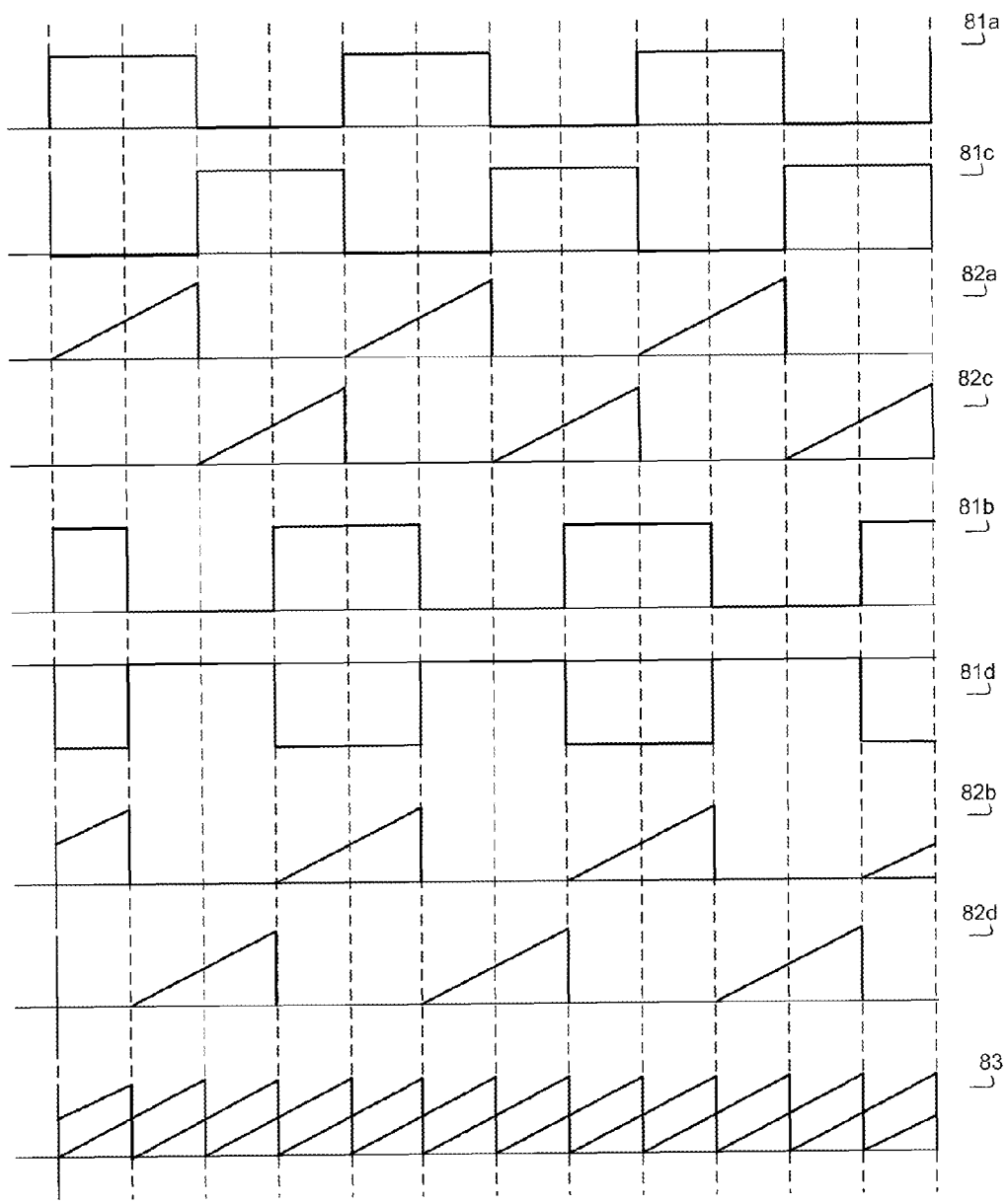

FIG. 8 illustrates waveforms associated with the parallel isolated flyback converter of FIG. 6, according to an illustrative embodiment of the invention.

Figure 9:
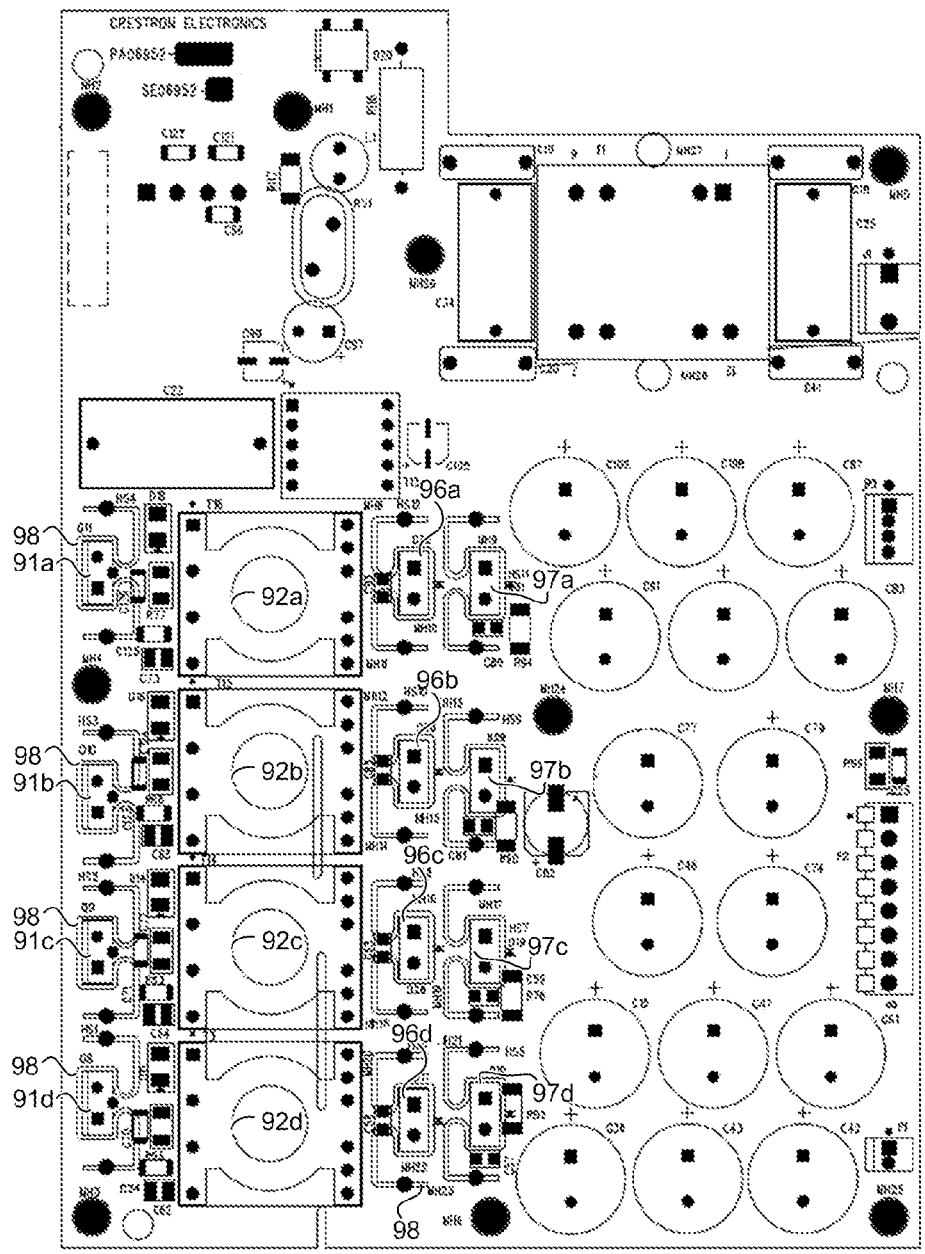

FIG. 9 is a layout of a printed circuit board power supply according to an illustrative embodiment of the invention.

Figure 10:
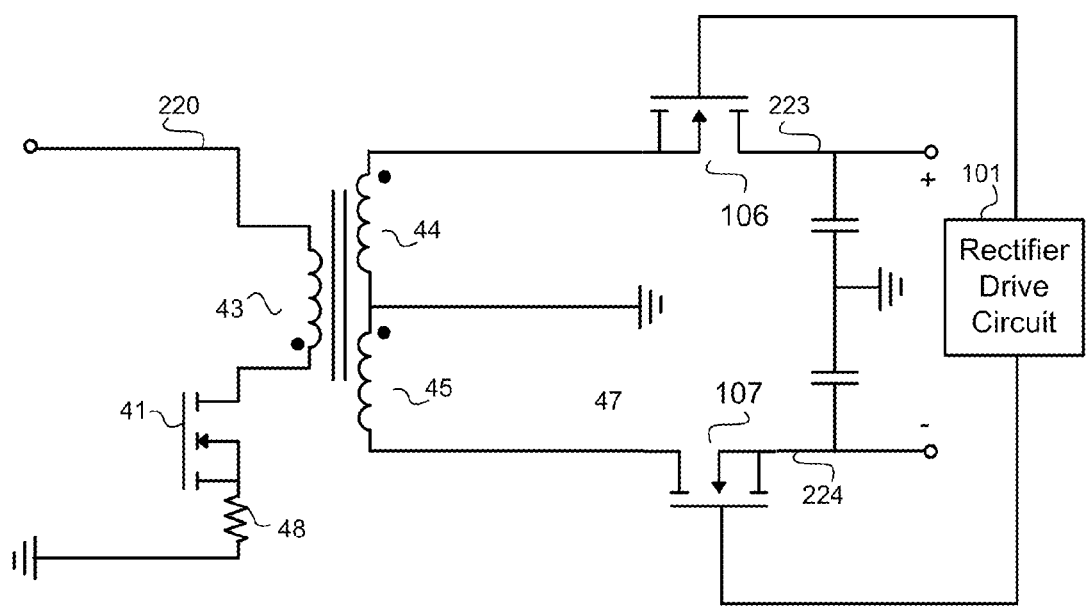

FIG. 10 is a diagram of the multiphase isolated flyback power circuit of the power supply of FIG. 2, according to an illustrative embodiment of the invention.

Figure 11:
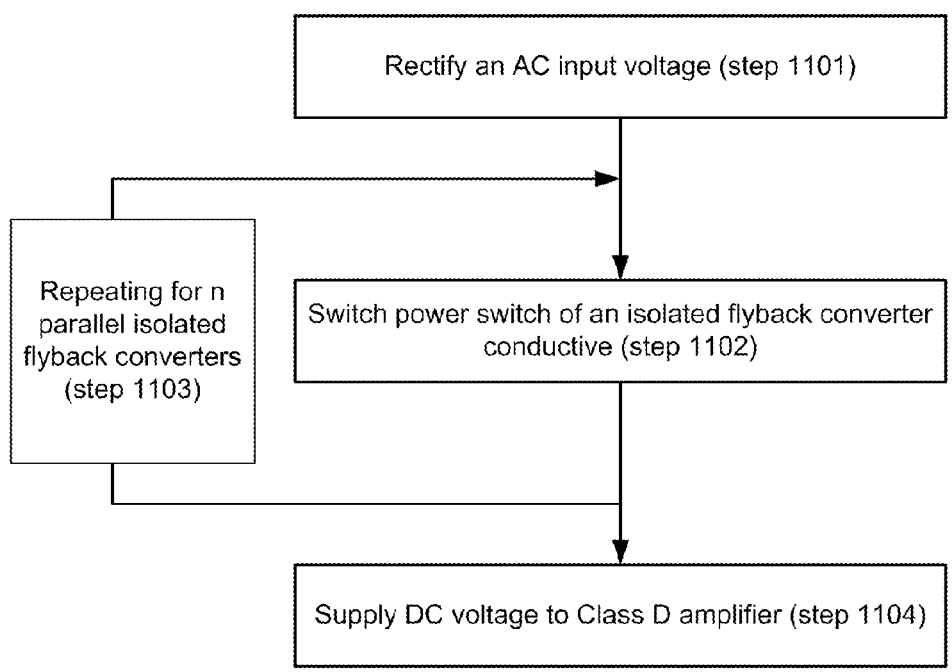

FIG. 11 is a flowchart illustrating steps for a method of providing power to a loudspeaker according to an illustrative embodiment of the invention.

Figure 12:
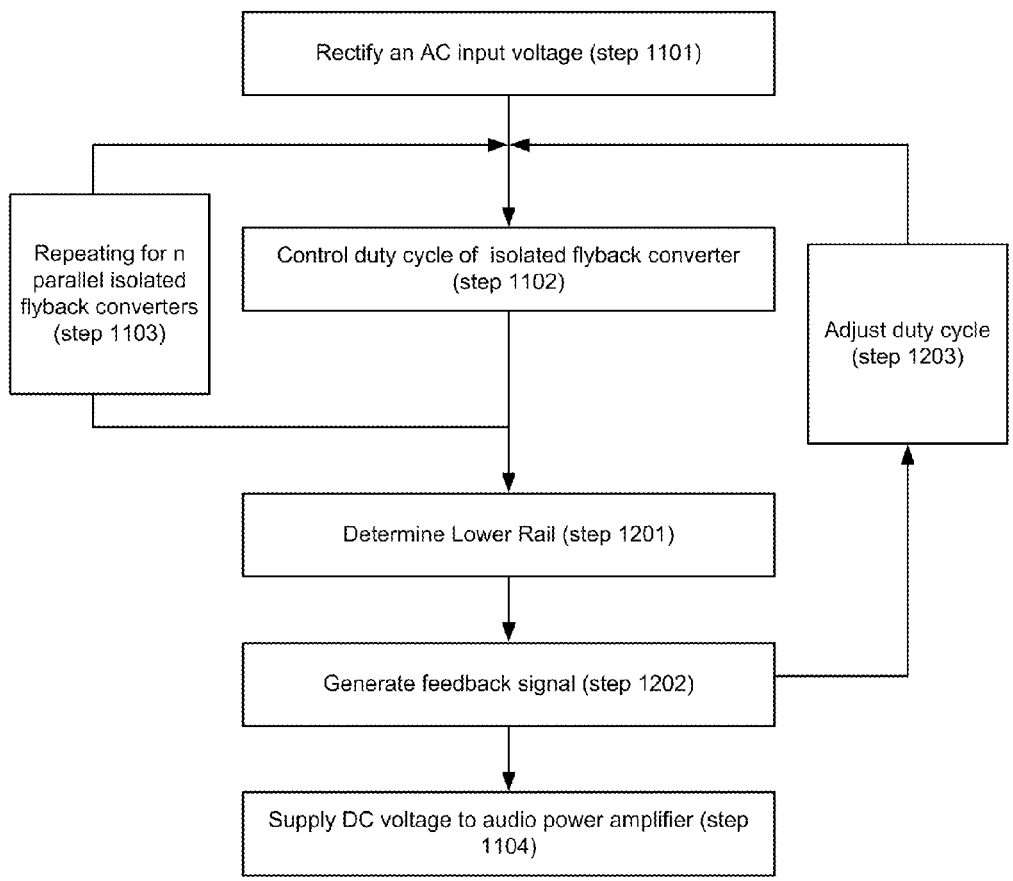

FIG. 12 is a flowchart illustrating additional steps of the method of FIG. 11, according to an illustrative embodiment of the invention.

Figure 13:
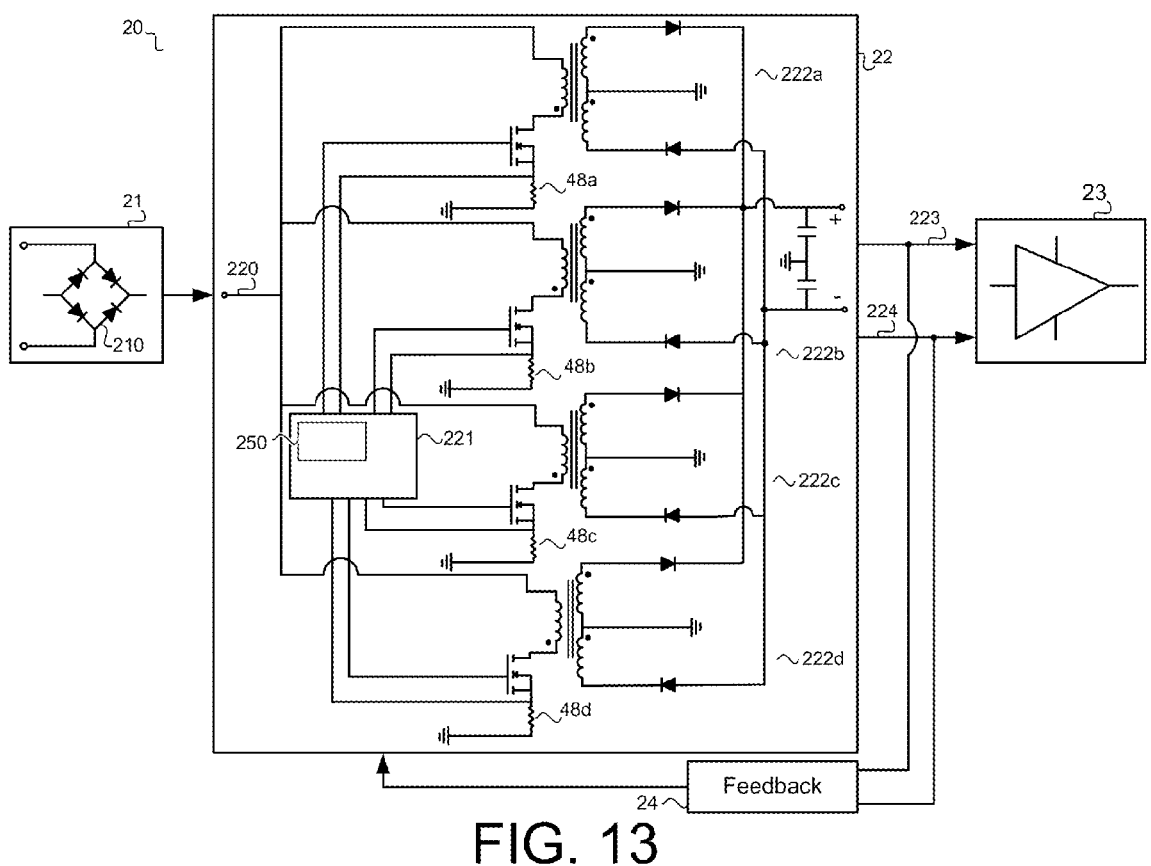

FIG. 13 shows a block diagram of the inventive audio amplifier comprising a power supply optimized for audio applications according to an illustrative embodiment of the invention.

Figure 14:
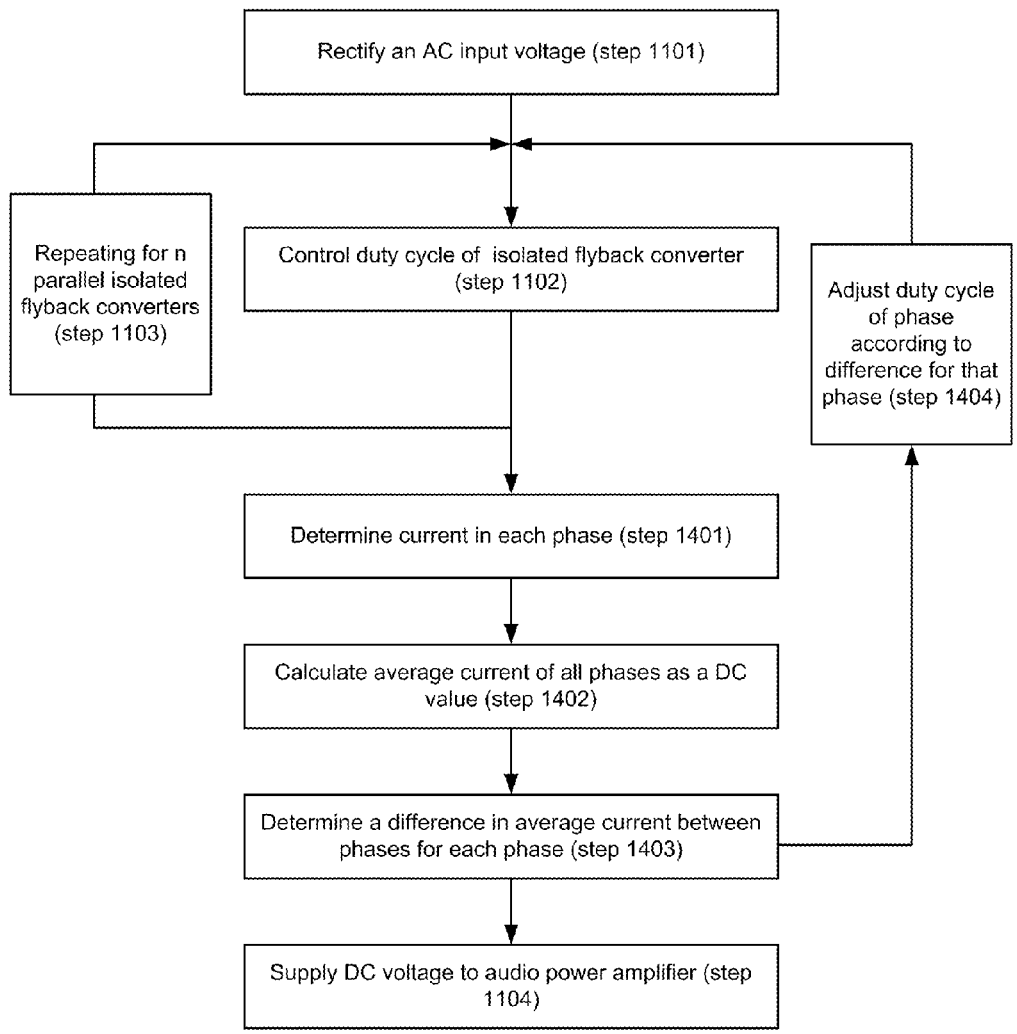

FIG. 14 is a flowchart illustrating additional steps of the method of FIG. 11, according to an illustrative embodiment of the invention.

LIST OF REFERENCE NUMBERS FOR THE MAJOR ELEMENTS IN THE DRAWING

The following is a list of the major elements in the drawings in numerical order.
10 prior art audio amplifier and power supply
11 rectifier circuit (p/o prior art audio amplifier and power supply 10)
12 power factor correction circuit (p/o prior art audio amplifier and power supply 10)
13 prior art isolation/conversion circuit (p/o prior art audio amplifier and power supply 10)
14 class D amplifier (p/o prior art audio amplifier and power supply 10)
21 rectifier circuit
22 multiphase isolated flyback power circuit
23 amplifier circuit
24 feedback circuit
31 input voltage
32 rectified input voltage
33 positive DC voltage
34 negative DC voltage
41 switch
42 coupled inductor
43 primary winding
44 positive secondary winding
45 negative secondary winding
46 first diode
47 second diode
48a-d current sensing resistor
49 node
51 primary current waveform
52 voltage waveform (at node 49)
53 positive output voltage waveform
54 negative output voltage waveform
55 output current waveform
61 multiphase clock
62 first drive circuit
63 second drive circuit
81a-d duty cycle signal
82a-d current waveform at switch
83 summed total of current waveforms
91a-d MOSFET
92a-d ferrite core transformer
96a-d first diode
97a-d second diode
98 stamped heat sink
101 rectifier drive circuit
106a-d first synchronized rectifier
107a-d second synchronized rectifier
210 full wave rectifier (p/o rectifier circuit 21)
220 input rail
221 control circuit
222a-d parallel isolated flyback converter
223 positive output rail
224 negative output rail
250 balancing circuit
1101 (step of) rectifying an AC input voltage
1102 (step of) controlling duty cycle of switch
1103 (step of) repeating step 1102
1104 (step of) supplying DC voltage to audio power amplifier
1201 (step of) determining lower rail
1202 (step of) generating feedback signal
1203 (step of) adjusting duty cycle signal

DETAILED DESCRIPTION OF THE INVENTION

The present invention involves a power supply for an audio amplifier. More specifically, the present invention provides a switched-mode power supply having inherent power factor correction (PFC) and optimized for application in audio amplifiers. The switched-mode power supply employs multiple isolated flyback converters operating synchronously with each other, each converting a portion of the input power. Advantageously, the optimized power supply does not require a separate power factor correction stage, thereby reducing the component count and size of the audio amplifier. Additionally, by distributing power conversion across multiple phases of flyback converters, the audio amplifier power supply may be manufactured from smaller components in a printed circuit board (PCB) with a tight layout thereby minimizing electromagnetic interference.

This power supply topology is particularly suited for audio applications as peak audio power is typically required for short-duration audio peaks lasting up to 500 milliseconds (ms), followed by longer periods of much lower power demand. This results in an average continuous power requirement which typically does not exceed one eighth (⅛) of the peak audio power. This invention uses these characteristics advantageously to achieve small size and low cost, by using multiple low cost, low power devices operating synchronously in multiple phases, with high power conversion efficiency to deliver the high peak audio power requirement and the lower continuous audio power with minimal heatsinking and minimal weight.

FIG. 2 is a block diagram of the inventive audio amplifier and FIG. 3 shows voltage and current waveforms associated with the inventive audio amplifier, according to an embodiment of the invention. The audio amplifier power supply comprises a rectifier circuit 21, a multiphase isolated flyback power circuit 22 configured for operating in discontinuous mode, and a feedback circuit. The audio amplifier power supply is coupled to an amplifier circuit 23.

The rectifier circuit 21 comprises a full wave rectifier and is configured for receiving an input voltage 31 from an alternating current (AC) power source. For example, the input voltage may be a voltage in the range of eighty-five (85) to two hundred sixty-five (265) Volts (V), such as a one hundred twenty (120) V sixty (60) Hertz (Hz) AC mains input voltage or a two hundred and thirty (230) V fifty (50) Hz AC mains input voltage. The rectifier circuit 21 is further configured for rectifying the input voltage 31 to a rectified direct current (DC) voltage 32. The multiphase isolated flyback power circuit 22 receives the rectified voltage 32 from the rectifier circuit 21 and supplies a positive DC voltage 33 to the amplifier circuit 23.

Throughout this description and in the drawings, the multiphase isolated flyback power circuit is described as supplying both a positive and negative DC voltage. However, as described later, the power circuit may be configured to supply a DC voltage of a single polarity such as for bridge mode audio amplifier applications which drive a bridge-tied load (BTL).

The amplifier circuit 23 amplifies an audio signal with the positive 33 and negative DC voltages 34 to a level suitable for driving a loudspeaker.

Advantageously, when operating in discontinuous mode, the isolated flyback topology of the power circuit 22 inherently yields a high power factor thereby negating the need for a separate power factor correction circuit in the audio amplifier power supply 20. Eliminating a separate power factor correction circuit from the audio amplifier power supply results in reduced cost, volume and component count. In addition to the reduced size and cost, electromagnetic interference (EMI) is minimized compared to audio amplifier power supplies with a separate PFC stage as the additional switching component is eliminated.

Those skilled in the art, however, will recognize that isolated flyback topologies are typically suited for use in low power applications, such as those converting power levels below 100 Watts (W). To overcome this limitation, power conversion is distributed across multiple isolated flyback converters operating synchronously such that each converts an equal portion of the input power.

Advantageously, in addition to the inherent power factor benefits by distributing power conversion across multiple parallel isolated flyback converters, additional cost, size and EMI benefits are realized. Because multiple isolated flyback converters are employed, component sizes of each flyback converter is relatively smaller resulting in tight layout configurations, bulk purchasing savings and less costly manufacturing expenses. EMI is minimized due to advantageous current summing of the multiple converters producing a waveform with minimal ripple current.

The multiphase isolated flyback power circuit 22 comprises an input rail 220, a positive output rail 223, a negative output rail 224, a control circuit 221, and a plurality of parallel isolated flyback converters 222a-d configured for being synchronously controlled by the control circuit 221. In embodiments of the invention configured for supplying a DC voltage of a single polarity, the power circuit comprises a single rail. In the illustrative audio amplifier power supply shown in FIG. 2, the multiphase isolated flyback power circuit 22 comprises four isolated flyback converters; however, it is to be understood that this is not meant as a limitation. Audio amplifier power supplies employing more than four and less than four flyback converters are contemplated and fall within the scope of the invention.

FIG. 4 is a diagram of the parallel isolated flyback converter of FIG. 2 in further detail, according to an embodiment of the invention. Referring to FIG. 4, each of the isolated flyback converters is configured for being synchronously controlled by the control circuit 221 and comprises a switch 41, such as metal-oxide-semiconductor field-effect transistor (MOSFET), a first diode 46, a second diode 47, and a coupled inductor 42. The coupled inductor further comprises a primary winding 43, a positive secondary winding 44, and a negative secondary winding 45. The number of turns of the secondary windings may be selected according to desired output voltage.

For each of the isolated flyback converters, the switch 41 and the primary winding 43 of the coupled inductor 42 are coupled in series between the input rail 220 and ground. The secondary side of the isolated flyback converter is electrically isolated from the primary side and comprises the positive 44 and negative secondary windings 45 of the coupled inductor 42 and the first diode 46 and second diode 47. The positive 44 and negative secondary windings 45 are inductively coupled to the primary winding 43. The first diode 46 is coupled in series between the positive secondary winding 44 and the positive output rail 223 and the second diode is coupled in series between the negative secondary winding 45 and the negative output rail 224.

FIG. 5 shows voltage and current waveforms associated with the multiphase isolated flyback power circuit 22 of FIG. 4, according to an illustrative embodiment of the invention. The control circuit 221 is configured to control the duty cycle of the multiple switches by synchronously transmitting a duty cycle signal to each switch 41, thereby switching the switches 41 conductive and nonconductive. The duty cycle of each switch 41 determines the amount of power supplied to the load by that phase and is determined in response to a feedback signal as described below. However, for the audio amplifier power supply to yield a high power factor, the duty cycle of each switch 41 must remain constant over the AC half cycle.

Signal 51 is a representation of the current which flows through the switch 41 of each phase. This sawtooth shaped current flows through a current sensing resistor 48 in each phase where it is converted to a voltage which can be used for current sensing and over-current protection for each switch 41. A characteristic of the discontinuous flyback converter is that the current in each switch 41 will start from 0 amps (A) and ramp up at a rate determined by the rectified input voltage 220 and the inductance of the primary winding of the coupled inductor. Since each phase is connected in parallel to a common input voltage 220 and each coupled inductor is identical, and further since the duty cycle of each phase is controlled via a common feedback signal, all phases will have identical sawtooth current waveforms reaching identical peak current levels. Therefore input and output currents are distributed equally among the multiple phases.

In each of the isolated flyback converters, when the switch 41 is conductive, the input voltage received from the rectifier circuit 21 is applied across the primary winding 43 of the coupled inductor 42 and energy is stored in the coupled inductor. For example, the coupled inductor 42 may be a ferrite core transformer with an air gap for storing energy. Waveform 52 is the voltage present at node 49. No current flows in the output loop of the isolated flyback converter when the switch 41 is conductive due to the first diode 46, second diode 47, and the polarity of the windings of the coupled inductor 42. Polarity dots in FIG. 4 indicate the polarity of each winding of the coupled inductor 42.

When the switch 41 is switched nonconducting, the energy stored in the primary winding 43 of the coupled inductor 42 is transferred to the positive secondary winding 44 and negative secondary winding 45. The solid line of waveform 53 shows the voltage induced across the positive secondary winding and the solid line of waveform 54 shows the voltage induced across the negative secondary winding. The dotted line of waveform 53 shows the voltage induced on the positive output rail and the dotted line of waveform 54 shows the voltage induced across the negative output rail.

Waveform 55 is a representation of the sawtooth current flowing through each of the first and second diodes in the secondary circuits of each phase. These currents will be equal among all phases as well, since they are determined by the peak currents reached in the primary winding of each coupled inductor.

Each of the switches of the isolated flyback converters is operated synchronously by the control circuit 221 such that they are switched conductive in succession. For a given 360 degree cycle, each switch is switched conductive 360/n degrees out of phase with the previous switch, with n being the number of switches. For example, in the illustrative embodiment shown in FIG. 2, each of the four isolated flyback converters is activated 90 degrees out of phase with the previous isolated flyback converter.

The inventive audio amplifier power supply further comprises a feedback circuit 24 configured for providing the feedback signal to the control circuit 221. The feedback circuit 24 is coupled to both the positive and negative rails of the isolated flyback converter and is configured to use the lower magnitude of the two rail voltages for feedback. The signal used for feedback is an "error-voltage" or difference signal, which is a voltage that is a representation of the difference between the lower rail voltage (i.e. actual voltage) and the desired rail voltage. The control circuit uses this error signal to determine the duty cycle to apply to the switch 41 in each phase. The control circuit will vary the duty cycle of the switch 41 so as to maintain minimal error between the actual output voltage and the desired output voltage. Since all controllers are fed with a common feedback signal, the duty cycle of the switch 41 of each phase is identical.

The "lowest rail" regulation scheme is advantageous to prevent clipping in the audio amplifier by maintaining adequate voltage headroom for the positive and negative rails. Overvoltage protection can be added simply to this feedback scheme to prevent damage to any components of the power supply or audio amplifier. This OVP can place a hard limit on output voltage for both the positive and negative rail, by bounding or clamping the feedback duty cycle signal if an overvoltage is detected. Overvoltage may be caused by rail pumping, an operational characteristic of class-D amplifiers. As will be discussed further later in this specification, in an embodiment of the invention, synchronous rectifiers may be employed in place of the first and second diode to further prevent supply pumping.

FIG. 6 is a diagram of the parallel isolated flyback converter of FIG. 2 in further detail, according to another embodiment of the invention. In this embodiment the parallel isolated flyback converter is configured for outputting a DC voltage of a single polarity, such as for use in bridge mode amplifier applications. Each of the isolated flyback converters is configured for being synchronously controlled by the control circuit 221 and comprises a switch 41 such as a MOSFET, a first diode 46 and a coupled inductor 42. The coupled inductor further comprises a primary winding 43 and a secondary winding 45. The number of turns of the secondary winding may be selected according to desired output voltage. The operation of the parallel isolated flyback converter shown in FIG. 6 is similar to the operation of the parallel isolated flyback converter shown in FIG. 4 without a second secondary winding of opposite polarity and a second diode.

For each of the isolated flyback converters, the switch 41 and the primary winding 43 of the coupled inductor 42 are coupled in series between the input rail 220 and ground. The secondary side of the isolated flyback converter is electrically isolated from the primary side and comprises the positive and negative secondary windings of the coupled inductor 42 and the first and second diodes. The positive and negative secondary windings are inductively coupled to the primary winding 43. The first diode 46 is coupled in series between the positive secondary winding 44 and the positive output rail 223 and the second diode is coupled in series between the negative secondary winding 45 and the negative output rail 224.

FIG. 7 is a diagram of the multiphase isolated flyback power circuit of FIG. 2 according to a further embodiment of the invention and FIG. 8 illustrates waveforms associated with the multiphase isolated flyback power circuit of FIG. 7. In a further embodiment of the invention, the control circuit 221 comprises a multiphase clock 61, a first drive circuit 62 and a second drive circuit 63. The multiphase clock 61 is configured to output to a first clock signal having a fifty (50) percent duty cycle to the first drive circuit 62 and a second clock signal having a fifty percent duty cycle and being ninety (90) degrees out of phase with the first clock signal to the second drive circuit 63. In an embodiment of the invention, the multiphase clock is configured to employ spread spectrum modulation to increase the electromagnetic compatibility (EMC) of a the power supply.

The first drive circuit 62 is configured to generate a first duty cycle signal 81*a* for the first parallel isolated flyback converter 222*a* and a third duty cycle signal 81*c* for the third parallel isolated flyback converter 222*c*, according to the first clock signal. The current waveform at the first switch 82*a* begins ramping at every rising clock edge of the first duty cycle signal 81*a*. The current waveform at the third switch 82*c* begins ramping at every rising clock edge of the third duty cycle signal 81*c*. The first duty cycle signal 81*a* and third duty cycle signal 81*c* shown in FIG. 8 correspond to power converter duty cycles of fifty (50) percent.

The second drive circuit 63 is configured to generate a second duty cycle signal 81*b* for the second parallel isolated flyback converter 222*b* and a fourth duty cycle signal 81*d* for the fourth parallel isolated flyback converter 222*d*, according to the second clock signal. The current waveform at the second switch 82*b* begins ramping at every rising clock edge of the second duty cycle signal 81*b*. The current waveform at the fourth switch 82*d* begins ramping at every rising clock edge of the fourth duty cycle signal 81*d*. The second duty cycle signal 81*b* and the fourth duty cycle 81*d* signal shown in FIG. 8 correspond to power converter duty cycles of fifty (50) percent.

Waveform 83 shows a combination of the four current waveforms at each of the four switches. Since there are multiple synchronous phases operating with identical currents and 360/n degrees apart, the current waveforms will overlap resulting in an advantageous summing of the currents of all phases. This results in a lower root mean square (RMS) value of current. As the RMS value of current determines most component and circuit power losses, this summing results in lower power losses and lower current requirements for the components attached to the "common" input and output nodes, such as capacitors and fuses. This in turn allows for physically smaller components to be employed.

FIG. 9 shows a printed circuit board power supply, according to an embodiment of the invention. In this embodiment, the power supply further comprises a PCB. Each of the multiphase isolated flyback converter switches is a MOSFET 91*a-d* and each coupled transformer is a ferrite core transformer 92 with an air gap. The MOSFETS 91*a-d* and ferrite core transformers 92 are disposed on a surface of the PCB along with other electronic components and connections.

Because of the multiphase scheme employed by the power supply, a tight layout of components on the PCB is achieved resulting in a minimized area of the PCB.

This relatively small layout also reduces the loop area of the circuit thereby making the PCB a poor EMI antenna. Because the multiphase architecture employed by the audio amplifier power supply allows for physically smaller components for each phase, these physically smaller components may be packed together tighter on the PCB thereby requiring shorter interconnecting traces between components. This results in a tighter layout with small area current loops as compared to switched mode power supplies not employing a multiphase topology.

Even though the multiphase design has multiple EMI sources, surprisingly it is a weaker source of radiated EMI than single phase audio amplifier power supplies. Single phase audio amplifier power supplies employ a single larger switch on a larger heatsink with a larger coupled inductor. Due to the physical size of these components, they can only be packed so close. Therefore, the interconnecting traces will be longer and the loop area of the circuit larger. This results in a more efficient antenna and current that is four times larger than in the above multiphase power supply. Contrastingly, each of the EMI sources in the multiphase design is smaller in both area and current magnitude. Additionally, because each phase is synchronized with the other phases, not all phases are radiating at the same time. Rather their EMI emissions sum in a RMS fashion which yields a lower amplitude EMI signature.

Additionally, the multiphase power supply is easier to assemble than a single phase power supply. In a single phase design, or standard conventional design, a single large power switch would be used in a transistor package which features an uninsulated metal tab that would require it to be screwed down to a substantial heat sink, using nuts, washers and either thermal grease or a thermally-conductive, electrically insulating pad. Further, the heatsink would require mounting to the PCB or chassis using screws and washers. The steps involved in this mechanical mounting involve labor and skill, which both contribute to cost of assembly.

In the inventive multiphase approach, the power levels processed by each phase are low enough that the power transistor may be housed in a completely insulated plastic package. This package may be easily slipped into a stamped heat sink 98, without any mounting hardware, grease or insulating pads. Additionally, this type of stamped heatsink has solderable tabs, allowing it to be soldered directly to the PCB.

FIG. 10 is a diagram of the multiphase isolated flyback power circuit of the power supply of FIG. 2, according to an illustrative embodiment of the invention. In a further embodiment of the invention, the first and second diodes in each of the parallel isolated flyback converters 222a-d can be replaced by a first synchronous rectifier 106a-d and a second synchronous rectifier 107a-d, respectively. In this embodiment, the multiphase isolated flyback power circuit further comprises a rectifier drive circuit 101 for synchronously switching each synchronous rectifier conductive and nonconductive.

By advantageously timing the drive signals of the synchronous rectifiers, two chief benefits result. The first is an increase in power conversion efficiency due to the lower conduction losses of the synchronous rectifiers as compared to the diodes. The second is that power supply rail pumping can be eliminated. Power supply rail pumping is an inherent characteristic of class D amplifiers operating off of dual polarity rail voltages. The synchronous rectifiers force an equalization of the positive and negative rails through transformer action and tight magnetic coupling between the positive and negative transformer windings.

FIG. 11 is a flowchart of a method for supplying power with inherent power factor correction to an audio power amplifier in accordance with an illustrative embodiment of the invention. In step 1101, a rectifier circuit rectifies an input voltage from an AC power source.

In step 1102, the duty cycle of a switch of a parallel isolated flyback converter is controlled such that the parallel isolated flyback converter converts a portion of the input power.

In step 1103, the step of controlling the duty cycle of a switch of a parallel isolated flyback converter is repeated in succession for n parallel isolated flyback converters such that the duty cycle of each successive switch of the n parallel isolated flyback converters is 360/n degrees out of phase with the duty cycle of the previous switch.

In step 1104, a phase summed direct current voltage is supplied to an audio power amplifier. In embodiments of the invention in which each each of the n parallel isolated flyback converters comprises a coupled inductor further comprising a positive secondary winding and a negative secondary winding, the phase summed direct current voltage is a bipolar direct current voltage.

FIG. 12 is a flowchart of additional steps of the method of FIG. 11, according to an illustrative embodiment of the invention. In step 1201, the lower magnitude between the positive DC voltage and negative DC voltage supplied by the n parallel isolated flyback converters is determined.

In step 1202, an error feedback signal is generated by comparing the lower magnitude of the positive rail and the negative rail to a desired voltage.

In step 1203, the duty cycle of the switch of each of the n parallel isolated flyback converters is adjusted according to the error feedback signal.

FIG. 13 shows a block diagram of the inventive audio amplifier comprising a power supply optimized for audio applications according to an illustrative embodiment of the invention. While the duty cycle of each phase of the multiphase isolated flyback power circuit is controlled by a common feedback circuit, in embodiments of the invention the actual duty cycle of all phases will not be identical, due to real-world differences, such as manufacturing tolerances and imperfections, between components and integrated circuits. To make up for these small timing differences between phases, in an embodiment of the invention, the control circuit may further comprise a balancing circuit 250.

The balancing circuit 250 receives a current signal from each of the phases. For example, each phase of the multiphase isolated flyback power circuit may comprise a current sensing resistor 48a-d. Each current sensing resistor is configured for measuring the current in that phase and supplying a current signal to the balancing circuit. The balancing circuit receives the current signal for each phase and averages these currents to an average direct current (DC) value. In this embodiment, the balancing circuit comprises a difference amplifier. For each phase, the difference amplifier acts to increase or decrease the duty cycle of each phase in order to minimize the difference between the DC current value of that phase and the average DC value of all phases.

FIG. 14 is a flowchart of additional steps of the method of FIG. 11, according to an illustrative embodiment of the invention. In step 1401, a current flowing across the switch of each of the n parallel isolated flyback converters is determined. For example, in an embodiment of the invention, this current may be sensed by a current sensing element, such as a current sensing resistor in each parallel isolated flyback converters.

In step 1402, an average current of each of the n parallel isolated flyback converters is calculated as a DC value.

In step 1403, for each of the n parallel isolated flyback converters, a difference between the average current and the current in that parallel isolated flyback converter is determined.

In step 1404, for each of the n parallel isolated flyback converters the duty cycle of that parallel isolated flyback converter is adjusted according to the determined difference.

INDUSTRIAL APPLICABILITY

To solve the aforementioned problems, the present invention is a unique device in which an audio amplifier employs a class D amplifier and a power supply optimized for audio applications.

LIST OF ACRONYMS USED IN THE DETAILED
DESCRIPTION OF THE INVENTION

The following is a list of the acronyms used in the specification in alphabetical order.
AC alternating current
DC direct current
EMC electromagnetic compatibility
EMI electromagnetic interference
Hz Hertz
MOSFET metal oxide semiconductor field-effect transistor
PCB printed circuit board
PFC power factor correction
RMS root mean square
SMPS switched-mode power supply
V Volts

ALTERNATE EMBODIMENTS

Those skilled in the art will recognize that power gain is a primary differentiator of audio amplifiers. Advantageously, the power supply is scalable to provide more power gain in the audio amplifier. The power supply of the inventive audio amplifier has a scalable architecture due to the use of parallel isolated flyback converters. For example, with modifications to the operation of the multiphase clock and drivers, additional parallel isolated flyback converters may be added to increase the power gain. Additionally, the positive and negative output voltage can be scaled up or down as desired to achieve the power gain in the audio amplifier by changing the number of turns of the winding of the coupled inductor.

What is claimed is:

1. An audio amplifier power supply with inherent power factor correction, the audio amplifier power supply comprising:
   (a) a rectifier circuit configured for rectifying an input voltage from an alternating current (AC) power source;
   (b) a discontinuous mode multiphase isolated flyback power circuit configured for receiving the rectified input voltage from the rectifier circuit and supplying a phase-summed direct current (DC) voltage; and
   (c) wherein the discontinuous mode multiphase isolated flyback power circuit further comprises a balancing circuit configured for balancing currents across each phase of the multiphase isolated flyback power circuit.

2. The audio amplifier power supply of claim 1 wherein the discontinuous mode multiphase isolated flyback power circuit comprises:
   (a) an input rail;
   (b) an output rail;
   (c) a control circuit further comprising the balancing circuit; and
   (d) a plurality of parallel isolated flyback converters coupled in parallel between the input rail and the output rail and configured for being synchronously controlled by the control circuit to supply the phase-summed direct current (DC) voltage.

3. The audio amplifier power supply of claim 2 wherein each one of the plurality of parallel isolated flyback converters further comprises:
   (a) a switch configured for being synchronously switched conductive and nonconductive by the control circuit;
   (b) a coupled inductor, the coupled inductor comprising
      (i) a primary winding coupled in series between the switch and the input rail, and
      (ii) a secondary winding inductively coupled to the primary winding;
   (c) an output diode coupled in series between the secondary winding and the output rail; and
   (d) a current sensing element configured for sensing the current in the switch.

4. The audio amplifier power supply of claim 1 wherein the discontinuous mode multiphase isolated flyback power circuit comprises
   (a) an input rail;
   (b) a positive output rail;
   (c) a negative output rail;
   (d) a control circuit; and
   (e) a plurality of parallel isolated flyback converters coupled in parallel between the input rail and the positive output rail and negative output rail and wherein the plurality of parallel isolated flyback converters are configured for being synchronously controlled by the control circuit to produce a phase-summed direct current (DC) voltage.

5. The audio amplifier power supply of claim 4 wherein each one of the plurality of parallel isolated flyback converters further comprises:
   (a) a switch configured for being synchronously switched conductive and nonconductive by the control circuit;
   (b) a coupled inductor, the coupled inductor comprising
      (i) a primary winding coupled in series between the switch and the input rail,
      (ii) a positive secondary winding inductively coupled to the primary winding, and
      (iii) a negative secondary winding inductively coupled to the primary winding;
   (c) a first diode coupled in series between the positive secondary winding and the positive output rail;
   (d) a second diode coupled in series between the negative secondary winding and the negative output rail; and
   (e) a current sensing element configured for sensing the current in the switch.

6. The audio amplifier power supply of claim 5 wherein the control circuit is configured for synchronizing the duty cycles of the switches such that each one of the plurality of parallel isolated flyback converters converts a portion of the input power.

7. The audio amplifier power supply of claim 6 wherein n is the number of parallel isolated flyback converters and the duty cycle of each successive switch is synchronized 360/n degrees out of phase with the previous switch.

8. The audio amplifier power supply of claim 4 further comprising a feedback circuit configured for transmitting a feedback signal to the control circuit wherein the feedback signal is determined from the lower magnitude of the positive output rail and the negative output rail.

9. The audio amplifier power supply of claim 8 wherein the feedback circuit employs overvoltage protection.

10. The audio amplifier power supply of claim 4 further comprising a rectifier control circuit and wherein each one of the plurality of parallel isolated flyback converters further comprises:
   (a) a switch configured for being synchronously switched conductive and nonconductive by the control circuit;
   (b) a coupled inductor, the coupled inductor comprising
      (i) a primary winding coupled in series between the switch and the input rail,
      (ii) a positive secondary winding inductively coupled to the primary winding, and
      (iii) a negative secondary winding inductively coupled to the primary winding;
   (c) a first synchronized rectifier coupled in series between the positive secondary winding and the positive output rail and configured for being synchronously controlled by the rectifier control circuit; and
   (d) a second synchronized rectifier coupled in series between the negative secondary winding and the negative output rail and configured for being controlled by the rectifier control circuit.

11. The audio amplifier power supply of claim 5 wherein each switch of the plurality of parallel isolated flyback converters is a plastic insulated power transistor.

12. The audio amplifier power supply of claim 11 wherein each plastic insulated power transistor is thermally coupled to a stamped heat sink soldered to a printed circuit board.

13. The audio amplifier power supply of claim 5 wherein each coupled inductor of the plurality of parallel isolated flyback converters is a ferrite core transformer with an air gap.

14. A method for supplying power inherently corrected for power factor, comprising the steps of:
   (a) rectifying an input voltage of an AC power source;
   (b) controlling the duty cycle of a switch of a parallel isolated flyback converter to convert a portion of the input power;
   (c) repeating the step of controlling the duty cycle of a switch of a parallel isolated flyback converter to convert a portion of the input power for n parallel isolated flyback converters in succession such that the duty cycle of each successive switch of the n parallel isolated flyback converters is 360/n degrees out of phase with the duty cycle of the previous switch;
   (d) supplying a phase summed direct current voltage to an audio power amplifier;
   (e) determining a current through a switch for each of the n parallel isolated flyback converters;
   (f) calculating an average current of each of the n parallel isolated flyback converters as a direct current value;
   (g) for each of the n parallel isolated flyback converters, determining a difference between the average current and the current in that phase; and
   (h) for each of the n parallel isolated flyback converters, adjusting the duty cycle of that parallel isolated flyback converter according to the determined difference.

15. The method of claim 14 wherein each of the n parallel isolated flyback converters comprises a coupled inductor further comprising a positive secondary winding and a negative secondary winding and wherein the phase summed direct current voltage is a bipolar direct current voltage.

16. The method of claim 15 further comprising the steps of:
   (a) determining a lower magnitude of a negative DC voltage and positive DC voltage supplied by the n parallel isolated flyback converters;
   (b) generating an error feedback signal according to the difference between the lower magnitude voltage and a desired voltage; and
   (c) adjusting the duty cycle of the switch of each of the n parallel isolated flyback converters according to the error feedback signal.

* * * * *